US011811532B2

(12) United States Patent
Gladwin et al.

(10) Patent No.: US 11,811,532 B2
(45) Date of Patent: *Nov. 7, 2023

(54) DYNAMICALLY PROCESSING DATA IN A VAST DATA INGESTION SYSTEM

(71) Applicant: Pure Storage, Inc., Mountain View, CA (US)

(72) Inventors: S. Christopher Gladwin, Chicago, IL (US); Greg R. Dhuse, Chicago, IL (US); Timothy W. Markison, Mesa, AZ (US); Wesley B. Leggette, Chicago, IL (US); Jason K. Resch, Chicago, IL (US); Gary W. Grube, Barrington Hills, IL (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/363,281

(22) Filed: Jun. 30, 2021

(65) Prior Publication Data

US 2021/0328719 A1    Oct. 21, 2021

Related U.S. Application Data

(63) Continuation of application No. 16/860,302, filed on Apr. 28, 2020, now Pat. No. 11,070,318, which is a
(Continued)

(51) Int. Cl.
*H04L 1/00* (2006.01)
*H03M 13/05* (2006.01)
(Continued)

(52) U.S. Cl.
CPC ............ *H04L 1/0076* (2013.01); *G06F 3/064* (2013.01); *G06F 3/067* (2013.01); *G06F 3/0619* (2013.01);
(Continued)

(58) Field of Classification Search
CPC ........ G06F 3/0619; G06F 3/064; G06F 3/067; G06F 11/1076; G06F 11/2053;
(Continued)

(56) References Cited

U.S. PATENT DOCUMENTS 4,092,732 A    5/1978  Ouchi
5,454,101 A    9/1995  Mackay
(Continued)

OTHER PUBLICATIONS

Chung; An Automatic Data Segmentation Method for 3D Measured Data Points; National Taiwan University; pp. 1-8; 1998.
(Continued)

*Primary Examiner* — Wing F Chan
*Assistant Examiner* — Leon Y Tseng
(74) *Attorney, Agent, or Firm* — Garlick & Markison; Timothy D. Taylor (57) ABSTRACT

A method begins with a first group of computing devices of a plurality of computing devices of a storage network receiving data objects having a first data type identifier of a plurality of data type identifiers, where the plurality of data type identifiers correspond to a plurality of data types associated with the data objects. The method continues with the first group of computing devices interpreting the data objects having the first data type identifier to sort, based on sorting criteria the data objects into a first processing category and a second processing category. The method continues with the first group of computing devices error encoding the data objects in the second processing category based on short term storage error encoding parameters to produce pluralities of sets of encoded data slices and sending the pluralities of sets of encoded data slices to storage and execution units for storage therein.

16 Claims, 8 Drawing Sheets

Related U.S. Application Data continuation of application No. 15/805,811, filed on Nov. 7, 2017, now Pat. No. 10,651,975, which is a continuation-in-part of application No. 15/213,329, filed on Jul. 18, 2016, now Pat. No. 10,200,156, which is a continuation of application No. 13/919,566, filed on Jun. 17, 2013, now Pat. No. 9,537,609.

(60) Provisional application No. 61/679,000, filed on Aug. 2, 2012.

(51) Int. Cl.

| | | |
|---|---|---|
| *G06F 3/06* | (2006.01) | |
| *H04L 67/1097* | (2022.01) | |
| *G06F 11/10* | (2006.01) | |
| *G06F 11/20* | (2006.01) | |
| *H03M 13/00* | (2006.01) | |
| *H04L 69/40* | (2022.01) | |
| *H03M 13/15* | (2006.01) | |
| *H03M 13/37* | (2006.01) | |

(52) U.S. Cl.
CPC ...... *G06F 11/1076* (2013.01); *G06F 11/2053* (2013.01); *H03M 13/05* (2013.01); *H04L 1/0041* (2013.01); *H04L 1/0057* (2013.01); *H04L 67/1097* (2013.01); *H03M 13/1515* (2013.01); *H03M 13/3761* (2013.01); *H03M 13/611* (2013.01); *H04L 69/40* (2013.01)

(58) Field of Classification Search
CPC ............. H03M 13/05; H03M 13/1515; H03M 13/3761; H03M 13/611; H04L 1/0041; H04L 1/0057; H04L 1/0076; H04L 67/1097; H04L 69/40
USPC ........................................................ 709/214
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers |
| 5,802,364 A | 9/1998 | Senator |
| 5,809,285 A | 9/1998 | Hilland |
| 5,890,156 A | 3/1999 | Rekieta |
| 5,987,622 A | 11/1999 | Lo Verso |
| 5,991,414 A | 11/1999 | Garay |
| 6,012,159 A | 1/2000 | Fischer |
| 6,058,454 A | 5/2000 | Gerlach |
| 6,128,277 A | 10/2000 | Bruck |
| 6,175,571 B1 | 1/2001 | Haddock |
| 6,192,472 B1 | 2/2001 | Garay |
| 6,256,688 B1 | 7/2001 | Suetaka |
| 6,272,658 B1 | 8/2001 | Steele |
| 6,301,604 B1 | 10/2001 | Nojima |
| 6,356,949 B1 | 3/2002 | Katsandres |
| 6,366,995 B1 | 4/2002 | Vilkov |
| 6,374,336 B1 | 4/2002 | Peters |
| 6,415,373 B1 | 7/2002 | Peters |
| 6,418,539 B1 | 7/2002 | Walker |
| 6,449,688 B1 | 9/2002 | Peters |
| 6,567,948 B2 | 5/2003 | Steele |
| 6,571,282 B1 | 5/2003 | Bowman-Amuah |
| 6,609,223 B1 | 8/2003 | Wolfgang |
| 6,718,361 B1 | 4/2004 | Basani |
| 6,760,808 B2 | 7/2004 | Peters |
| 6,785,768 B2 | 8/2004 | Peters |
| 6,785,783 B2 | 8/2004 | Buckland |
| 6,826,711 B2 | 11/2004 | Moulton |
| 6,879,596 B1 | 4/2005 | Dooply |
| 7,003,688 B1 | 2/2006 | Pittelkow |
| 7,024,451 B2 | 4/2006 | Jorgenson |
| 7,024,609 B2 | 4/2006 | Wolfgang |
| 7,080,101 B1 | 7/2006 | Watson |
| 7,103,824 B2 | 9/2006 | Halford |
| 7,103,915 B2 | 9/2006 | Redlich |
| 7,111,115 B2 | 9/2006 | Peters |
| 7,140,044 B2 | 11/2006 | Redlich |
| 7,146,644 B2 | 12/2006 | Redlich |
| 7,171,493 B2 | 1/2007 | Shu |
| 7,222,133 B1 | 5/2007 | Raipurkar |
| 7,240,236 B2 | 7/2007 | Cutts |
| 7,272,613 B2 | 9/2007 | Sim |
| 7,581,158 B2 | 8/2009 | Alstrup |
| 7,636,724 B2 | 12/2009 | De La Torre |
| 2002/0062422 A1 | 5/2002 | Butterworth |
| 2002/0166079 A1 | 11/2002 | Ulrich |
| 2003/0018927 A1 | 1/2003 | Gadir |
| 2003/0037261 A1 | 2/2003 | Meffert |
| 2003/0065617 A1 | 4/2003 | Watkins |
| 2003/0084020 A1 | 5/2003 | Shu |
| 2004/0024963 A1 | 2/2004 | Talagala |
| 2004/0122917 A1 | 6/2004 | Menon |
| 2004/0215998 A1 | 10/2004 | Buxton |
| 2004/0228493 A1 | 11/2004 | Ma |
| 2005/0100022 A1 | 5/2005 | Ramprashad |
| 2005/0114594 A1 | 5/2005 | Corbett |
| 2005/0125593 A1 | 6/2005 | Karpoff |
| 2005/0131993 A1 | 6/2005 | Fatula, Jr. |
| 2005/0132070 A1 | 6/2005 | Redlich |
| 2005/0144382 A1 | 6/2005 | Schmisseur |
| 2005/0229069 A1 | 10/2005 | Hassner |
| 2006/0047907 A1 | 3/2006 | Shiga |
| 2006/0136448 A1 | 6/2006 | Enzo |
| 2006/0156059 A1 | 7/2006 | Kitamura |
| 2006/0212782 A1 | 9/2006 | Li |
| 2006/0224603 A1 | 10/2006 | Correll, Jr. |
| 2007/0079081 A1 | 4/2007 | Gladwin |
| 2007/0079082 A1 | 4/2007 | Gladwin |
| 2007/0079083 A1 | 4/2007 | Gladwin |
| 2007/0088970 A1 | 4/2007 | Buxton |
| 2007/0174192 A1 | 7/2007 | Gladwin |
| 2007/0214285 A1 | 9/2007 | Au |
| 2007/0234110 A1 | 10/2007 | Soran |
| 2007/0283167 A1 | 12/2007 | Venters, III |
| 2008/0244353 A1 | 10/2008 | Dholakia |
| 2009/0094251 A1 | 4/2009 | Gladwin |
| 2009/0094318 A1 | 4/2009 | Gladwin |
| 2009/0132851 A1 | 5/2009 | Pruthi |
| 2010/0023524 A1 | 1/2010 | Gladwin |
| 2010/0199089 A1 | 8/2010 | Vysogorets |
| 2010/0218037 A1 | 8/2010 | Swartz |
| 2010/0287200 A1 | 11/2010 | Dhuse |
| 2011/0078277 A1 | 3/2011 | Baptist |
| 2012/0278587 A1 | 11/2012 | Caufield |
| 2013/0145173 A1 | 6/2013 | Shablygin |
| 2015/0154074 A1 | 6/2015 | Resch |

OTHER PUBLICATIONS

Cleversafe launches Hadoop without HDFS; online new article published in Jul. 2012.

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

(56) References Cited

OTHER PUBLICATIONS

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

DYNAMICALLY PROCESSING DATA IN A VAST DATA INGESTION SYSTEM

CROSS-REFERENCE TO RELATED APPLICATIONS

The present U.S. Utility Patent Application claims priority pursuant to 35 U.S.C. § 120 as a continuation of U.S. Utility application Ser. No. 16/860,302, entitled "FORWARDING DATA AMONGST COOPERATIVE COMPUTING DEVICES OF A MASSIVE DATA INGESTION SYSTEM", filed Apr. 28, 2020, which is a continuation of U.S. Utility application Ser. No. 15/805,811, entitled "FORWARDING DATA AMONGST COOPERATIVE DSTN PROCESSING UNITS OF A MASSIVE DATA INGESTION SYSTEM", filed Nov. 7, 2017, issued as U.S. Pat. No. 10,651,975 on May 12, 2020, which is a continuation-in-part of U.S. Utility application Ser. No. 15/213,329, entitled "STORING A STREAM OF DATA IN A DISPERSED STORAGE NETWORK", filed Jul. 18, 2016, issued as U.S. Pat. No. 10,200,156 on May 5, 2019, which is a continuation of U.S. Utility application Ser. No. 13/919,566, entitled "STORING A STREAM OF DATA IN A DISPERSED STORAGE NETWORK", filed Jun. 17, 2013, issued as U.S. Pat. No. 9,537,609 on Jan. 3, 2017, which claims priority pursuant to 35 U.S.C. § 119(e) to U.S. Provisional Application No. 61/679,000, entitled "PERFORMANCE OPTIMIZATION OF A DISTRIBUTED STORAGE AND TASK NETWORK", filed Aug. 2, 2012, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to cloud data storage.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
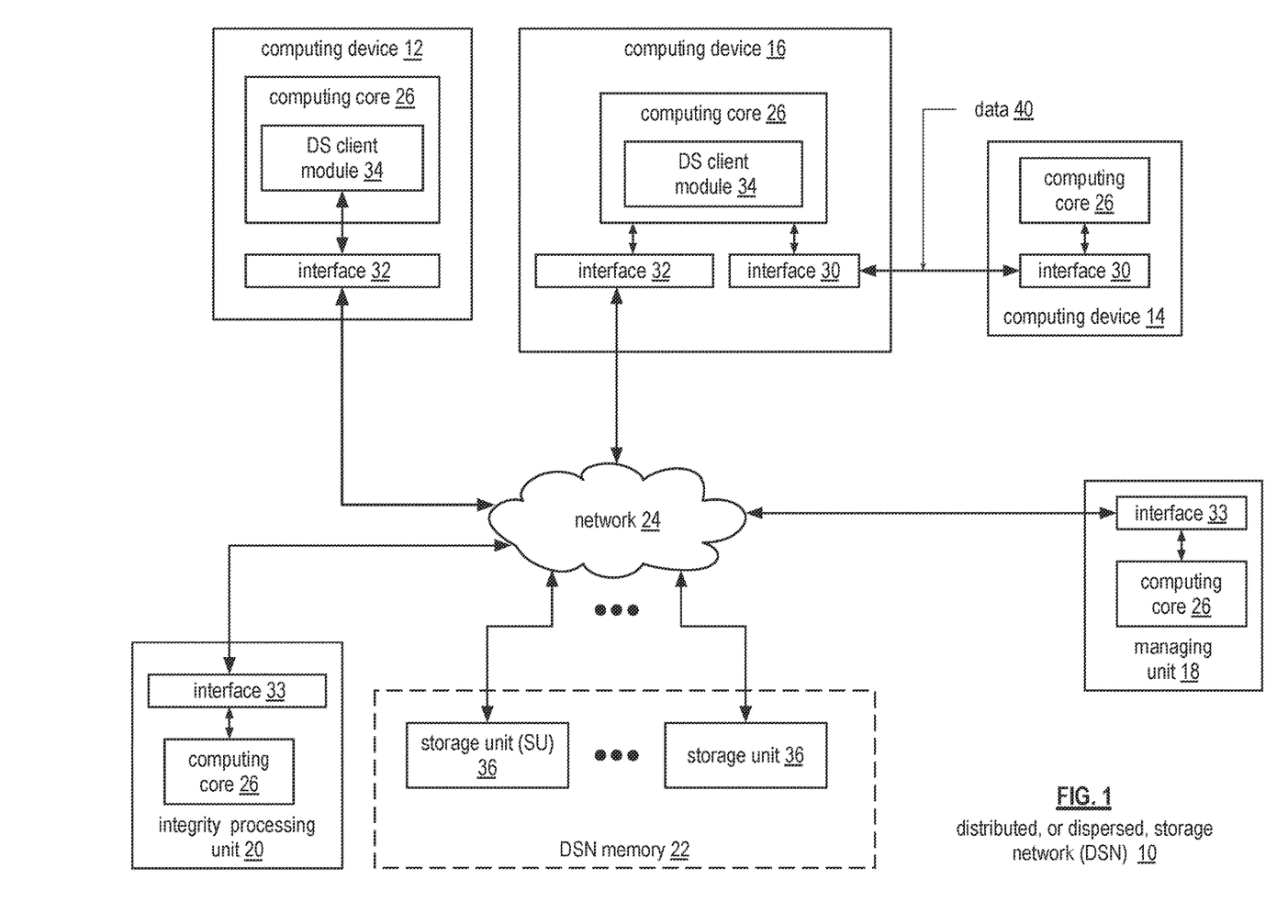
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
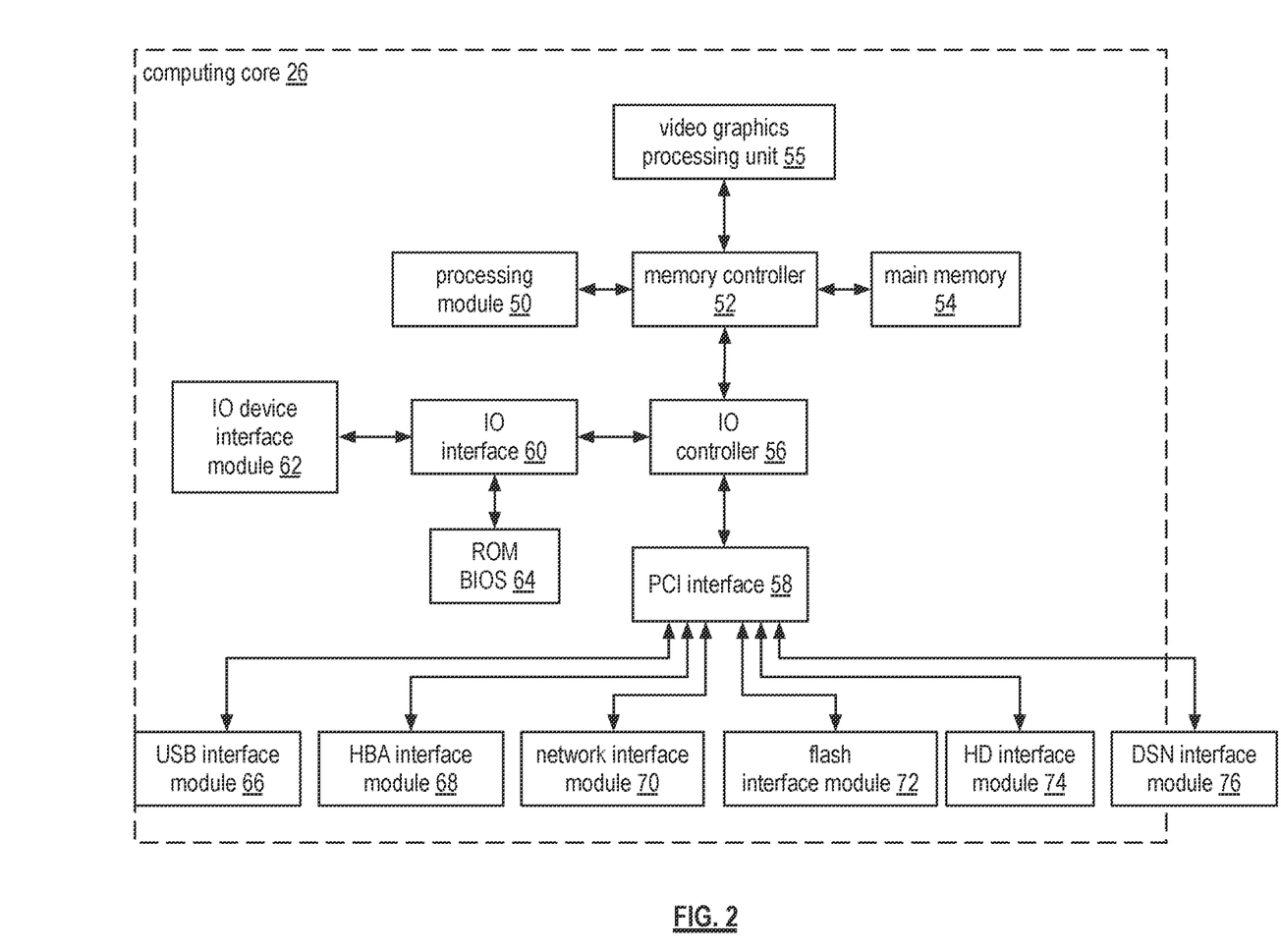
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data (e.g., data 40) on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figure 3:
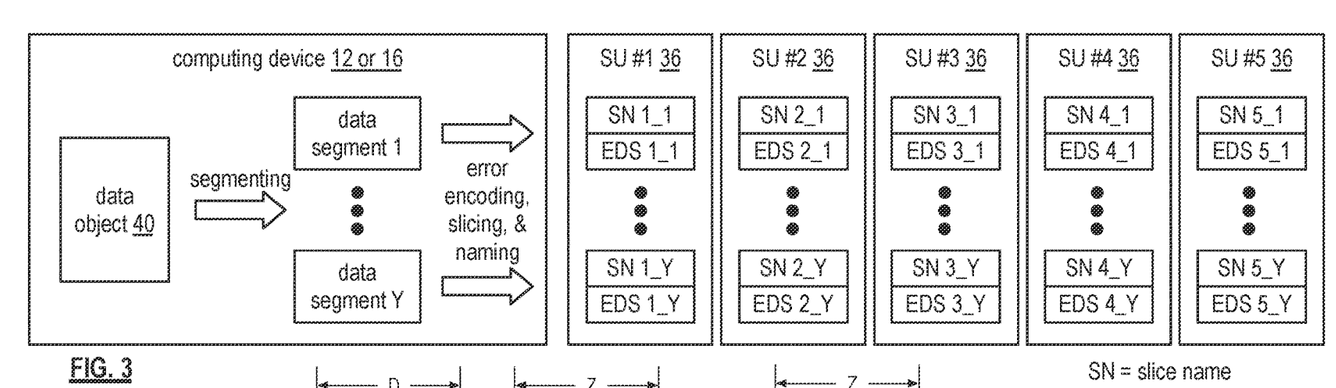
FIG. 3 is a schematic block diagram of an example of dispersed storage error encoding of data in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figure 4:
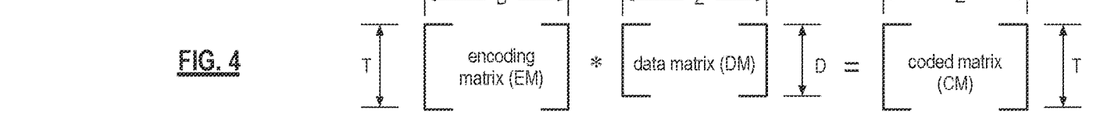
FIG. 4 is a schematic block diagram of a generic example of an error encoding function in accordance with the present invention.
Figure 5:
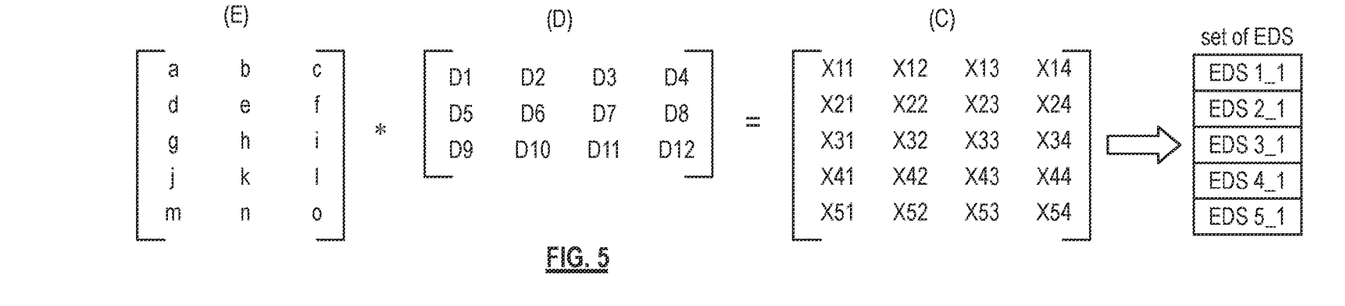
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
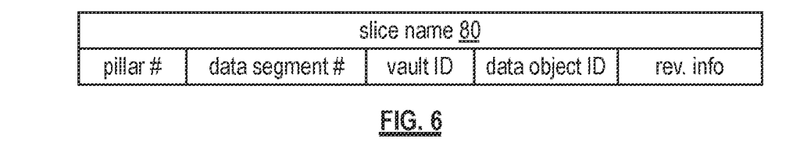
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
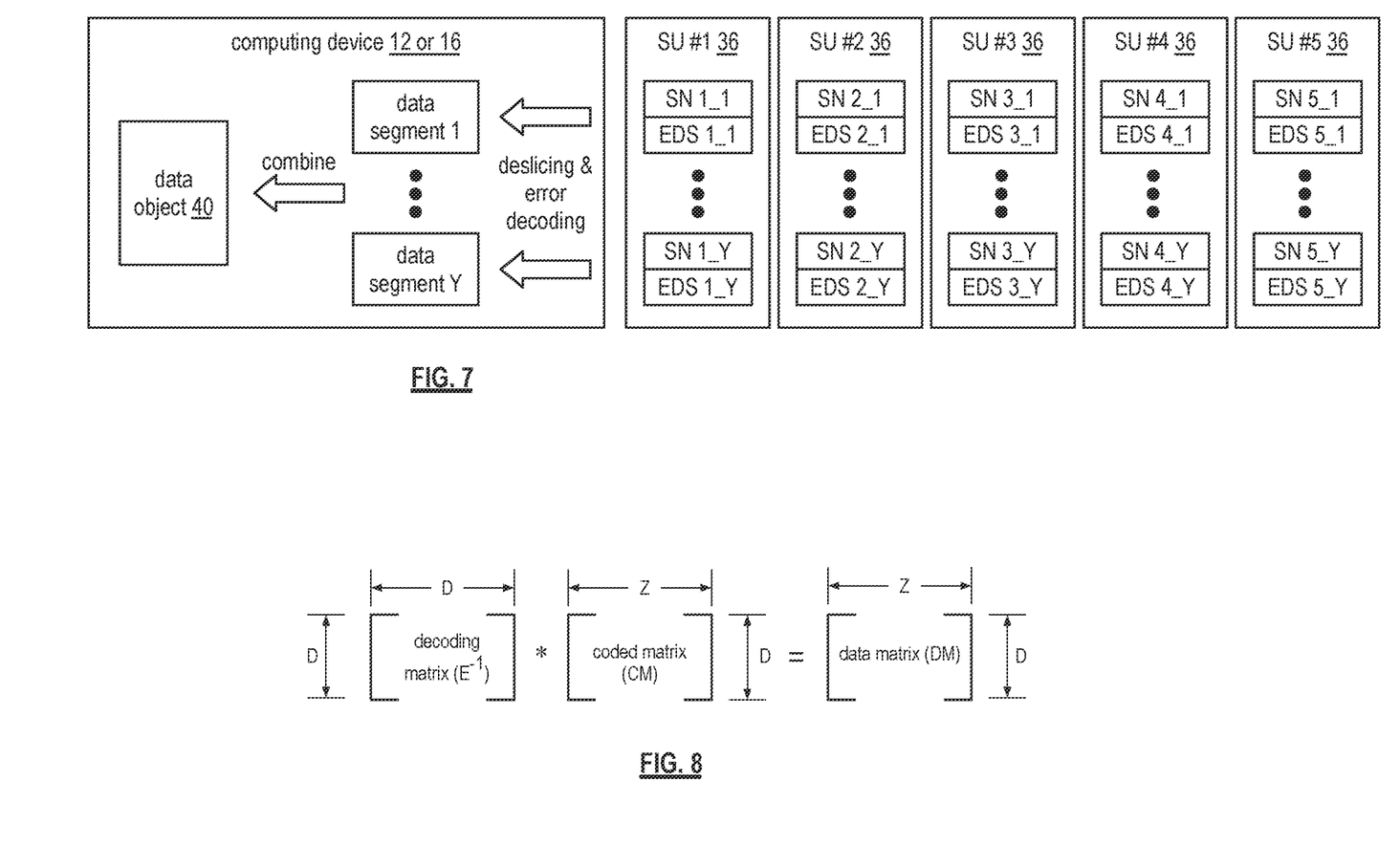
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
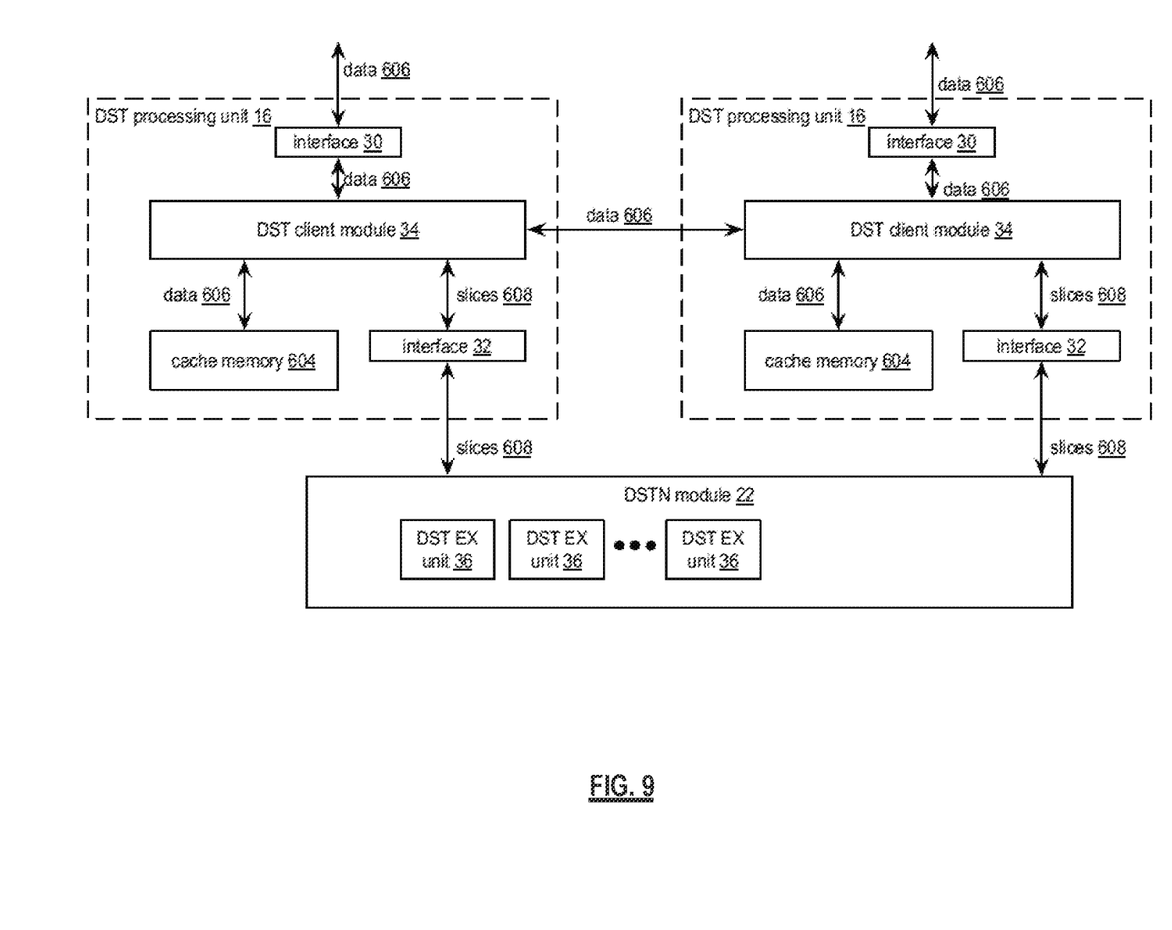
FIG. 9 is a schematic block diagram of an embodiment of a distributed computing system in accordance with the present invention.

FIG. 9 is a schematic block diagram of an embodiment of a distributed computing system that includes a first distributed storage and task (DST) processing unit 16, a second DST processing unit 16, and a distributed storage and task network (DSTN) module 22. Alternatively, the system includes more than two DST processing units 16. The first and second DST processing units 16 each includes an interface 30, a DST client module 34, a cache memory 604, and an interface 32. The DSTN module 22 includes a plurality of DST execution units 36.

The DST client module 34 of the first DST processing unit 16 receives data 606 via interface 30 and facilitates storage of the data 606 in the cache memory 604 associated with the first DST processing unit 16. The DST client module 34 of the first DST processing unit 16 updates a directory to associate a data identifier (ID) of the data 606 with an identifier of the cache memory 604 of the first DST processing unit 16. The DST client module 34 of the first DST processing unit 16 identifies the second DST processing unit 16 as associated with the data ID and sends the data 606 to the second DST processing unit 16. Alternatively, the DST client module 34 of the first DST processing unit 16 identifies a third DST processing unit 16 as associated with the data ID and sends the data 606 to the third DST processing unit 16. The identifying includes identifying a DST processing unit 16 that is associated with the data ID based on one or more of a lookup, a query, a request, a solicitation, and an error message.

When transfer is confirmed (e.g., the second DST processing unit 16 sends an acknowledgment to the first DST processing unit 16), the DST client module 34 of the first DST processing unit 16 updates a directory to associate the data ID with a cache memory identifier of the second DST processing unit 16. The DST client module 34 of the first DST processing unit 16 updates the directory to disassociate the data ID with the ID of the cache memory 604 of the first DST processing unit 16. The DST client module 34 of the first DST processing unit 16 facilitates deletion of the data 606 from the cache memory 604 of the first DST processing unit 16.

The DST client module 34 of the second DST processing unit 16 receives the data 606 and facilitates storage of the data 606 in the cache memory 604 of the second DST processing unit 16. The DST client module 34 of the second DST processing unit 16 facilitates transfer of the data 606 to the DSTN module as slices 608 and updates the directory to associate the data ID with the DSTN module 22 and to disassociate the data ID with the cache memory ID of the second DST processing unit 16. The DST client module 34 of the second DST processing unit 16 facilitates deletion of the data 606 from the cache memory 604 of the second DST processing unit 16.

Figure 10:
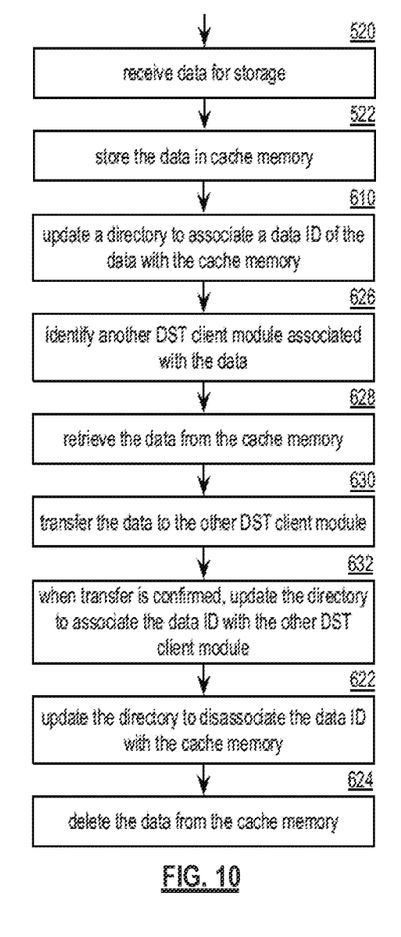
FIG. 10 is a flowchart illustrating an example of storing data in accordance with the present invention.

FIG. 10 is a flowchart illustrating another example of storing data. The method begins with steps 520 and 522, where a processing module (e.g., of a distributed storage and task (DST) client module) receives data for storage and stores the data in cache memory. The method continues with step 610, where the processing module updates a directory to associate a data identifier (ID) of the data with the cache memory. The method continues at step 626 where the processing module identifies another DST client module associated with the data. The identifying may be based on one or more of a lookup, a query, a request, performing a deterministic function on the data ID, a random selection, a round-robin selection, and an error message.

The method continues at step 628 where the processing module retrieves the data from the cache memory. The method continues at step 630 where the processing module transfers the data to the other DST client module. When the transfer is confirmed (e.g., a time period has ended, a favorable acknowledgment has been received), the method continues at step 632 where the processing module updates the directory to associate the data ID with the other DST client module. The method continues with step 622 and 624, where the processing module updates the directory to disassociate the data ID with the cache memory and to delete the data from the cache memory.

In addition, the processing module may receive a data retrieval request that includes the data ID. The processing module identifies a storage location based on a directory lookup utilizing the data ID. The processing module retrieves the data from the storage location and outputs the data to a requesting entity. The retrieval includes generating read slice requests and decoding slices to reproduce the data when the data is not stored in the cache memory or in another cache memory.

Figure 11:
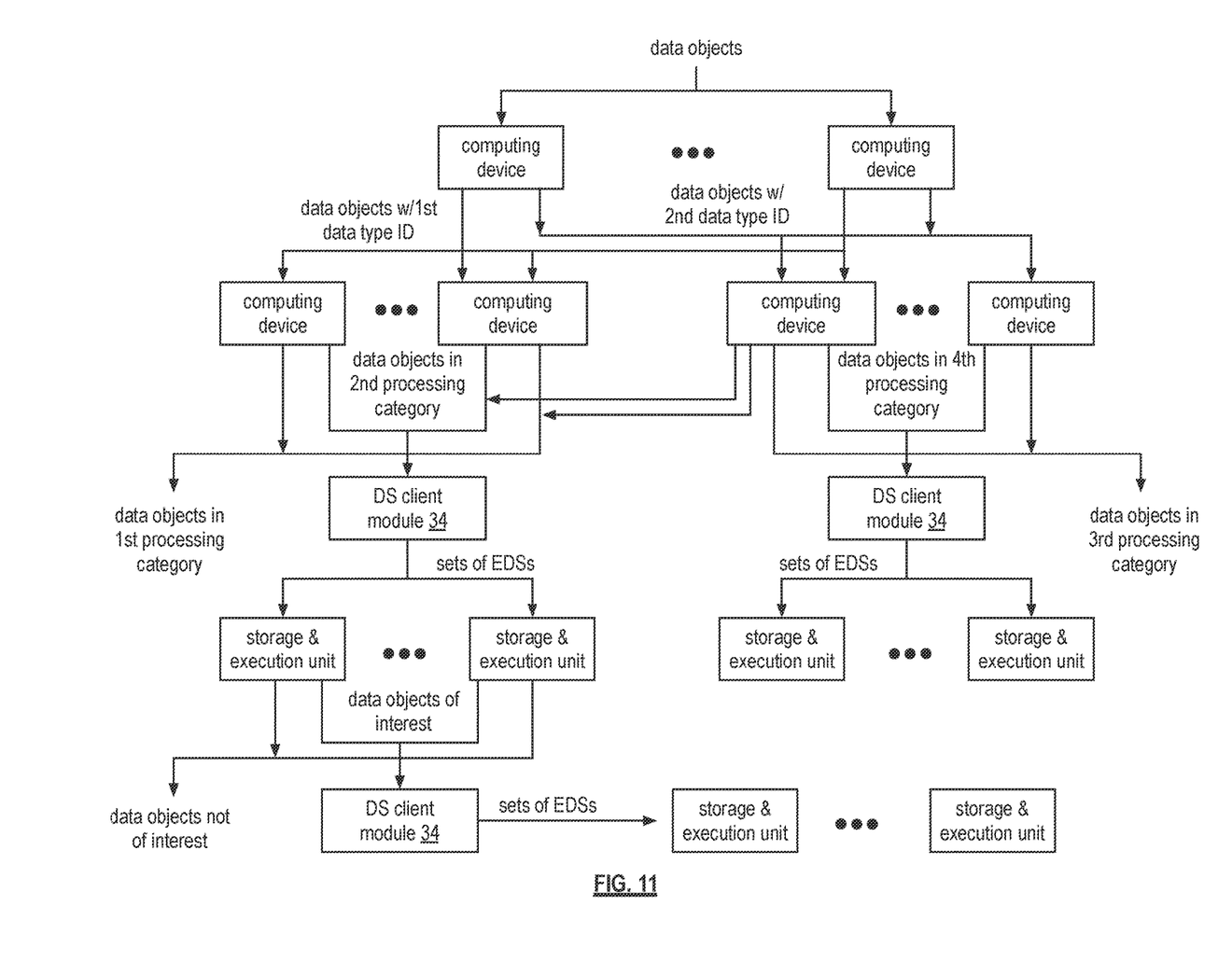
FIG. 11 is a schematic block diagram of a massive data ingestion system.

FIG. 11 is a schematic block diagram of a massive data ingestion system that includes a plurality of computing devices, a plurality of DS client modules 34, and a plurality of storage and execution units. A computing device of the plurality of computing devices may be implemented by the computing devices 12-16 of FIG. 1. The storage and execution units may function as a storage unit 36 of FIG. 1 that includes the DS client module 34 of FIG. 1. In example of operation, a first plurality of computing devices receives data objects. As the data objects are received, at least one of the plurality of computing devices assigns a data type identifier (ID) of a plurality of data type identifiers to each data object based on the data object being a data type of a plurality of data types. As an example, a first data object is audio recording and is assigned a data type ID of 003, which is a first data type ID. As another example, a second data object is an image of a wine glass, and is assigned a data type ID of 0005, which corresponds to containers and is a second data type ID.

Based on the data type ID, the computing device sends data objects of a first type to a first group of computing devices and send data objects of a second type to a second group of computing devices. For example, the second data object is sent to the second group of computing devices. Note that one or more computing devices may be in both the first and second groups of computing devices. The first group of computing devices interprets the data type identifiers based on a sorting criteria to sort data objects into a first processing category and a second processing category. The second group of computing devices interprets the data type identifiers based on a sorting criteria to sort data objects into a third processing category and a fourth processing category.

Based on the processing category, a computing device may determine that the data objects may be discarded, dispersed storage error encoded into a set of encoded data slices, or sent to another computing device (e.g., to a DS client module 34) or should be in a different processing category. For example, the second data object upon further analyzing, is determined to be glassware and thus should be in the second processing category. For example, data objects in the first processing category may be discarded and data objects in the second processing category may be sent to a DS client module 34 for further processing. As another example, a computing device may analyze a third data object with the second data type ID and determine the third data object should have been in the second processing category. Thus, the computing device sends the first data object to a DS client module 34. The DS client module 34 dispersed storage error encodes (e.g., in accordance with short term storage error encoding parameters (e.g., low pillar width to decode threshold difference (e.g., T−D=2), no encryption, small pillar width number, etc.) the first data object into a first set of encoded data slices and sends the first set of encoded data slices to a set of storage and execution units The set of storage and execution units analyze pluralities of sets of encoded data slices and determine data objects of interest and data objects not of interest. For example, the second data object (e.g., wine glass) is determined by a storage and execution unit to include a fingerprint and is thus a data object of interest. The data objects not of interest may be discarded or saved for later processing. The data objects of interest are sent to a DS client module 34, where the data objects of interest are dispersed storage error encoded in accordance with long term storage error encoding parameters (e.g., high pillar width to decode threshold difference (e.g., T−D=16), encryption, large pillar width number, etc.) to produce pluralities of sets of encoded data slices further processing (e.g., extraction of the fingerprint, a comparison of the fingerprint to a database, etc.). The system may be configured to sort a data object according to different criteria for each processing level. For example, a first processing level may perform an image search input of humans. A second processing level may perform an image search input of men. A third processing level may perform facial recognition with an input of a first characteristic (e.g., distance range between pupils). A fourth processing level may perform an image search input of tattoos. A fifth processing level may perform an image search with an input of dragons. Thus, in one embodiment, one processing chain of the system sends all data objects that are images of human men that have a certain distance range between their pupils and have a dragon tattoo to a set of storage and execution units for further processing (e.g., comparison with a Federal Bureau of Investigation database, saved for future analysis, etc.). The system of FIG. 11 is described in greater detail with reference to FIG. 12.

Figure 12:
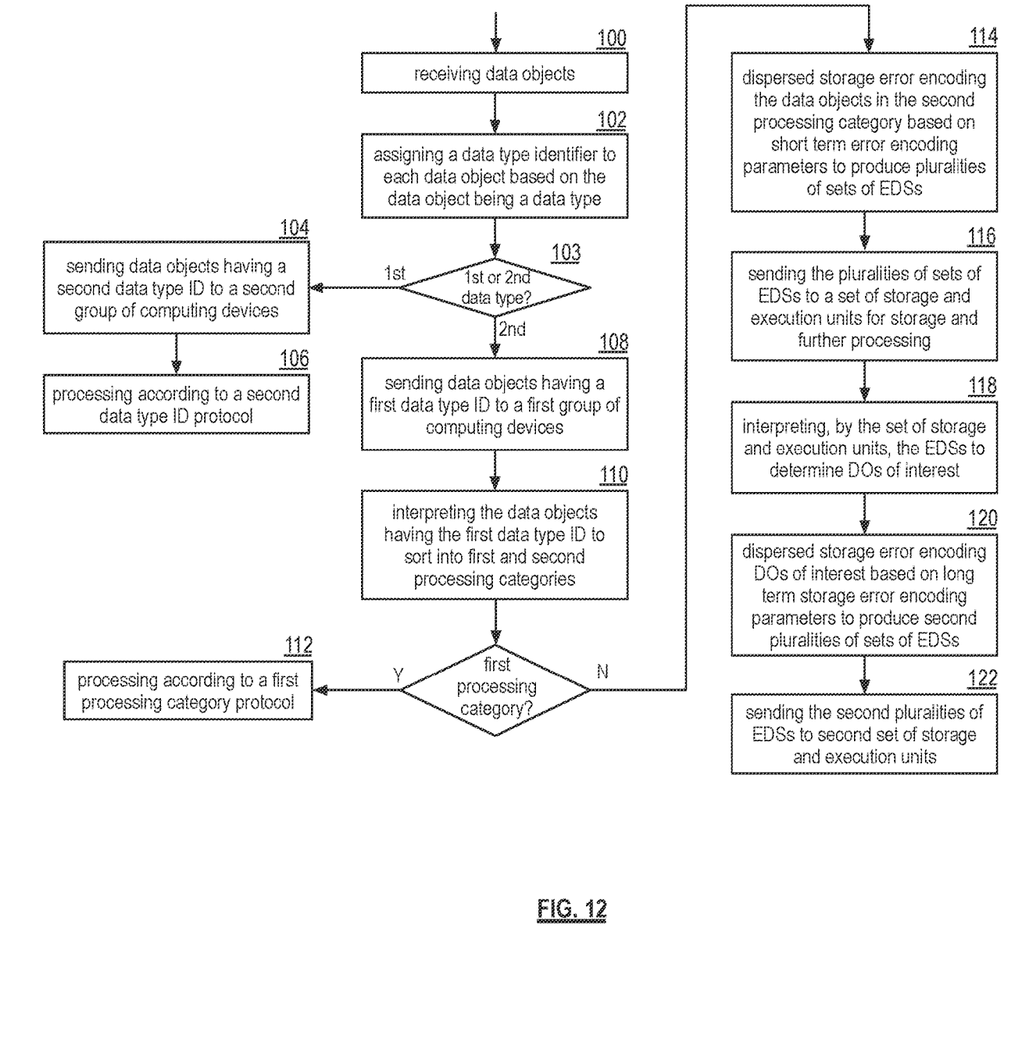
FIG. 12 is a flowchart of an example of a method of ingesting large amounts of data in a dispersed storage network (DSN) in accordance with the present invention.

FIG. 12 is a flowchart of an example of a method of ingesting large amounts of data in a dispersed storage network (DSN). The method begins with step 100, where a plurality of computing devices receives data objects (e.g., files, email, text, video, audio, image, social media posts, etc.). As the data objects are received, the method continues with step 102, where at least one of the plurality of computing devices assigns a data type identifier (ID) of a plurality of data type identifiers to each data object of the data objects based on the data object being a data type of a plurality of data types. The plurality of data types includes two or more a data file, an email, a blog, a white paper, a chat message, a social media post, a text message, voice data, and graphics. The data type ID (e.g., 001 for email, 002 for social media posts, etc.) is a unique identifier assigned to each particular data type. As one example, a data type ID of 00204 indicates a social media post of an image. As another example, a data type ID of 003 indicates voice data. As yet another example, a data type ID of 00144 indicates an email with a data file attachment.

The method continues at step 103, where a computing device determines whether a data object of the data objects have a first data type ID or a second data type ID. When data objects have the second data type ID, the method branches to step 104. When data objects have the first data type ID, the method continues with step 108, where the plurality of computing devices sends data objects having a first data type ID to a first group of computing devices of the plurality of computing devices. The method continues with step 110, where the first group of computing devices interprets the data objects having the first data type identifier to sort, based on sorting criteria, the data objects into a first processing category and a second processing category. The sorting criteria includes one or more of a word search, an image search, destination information, facial recognition, encryption type and source information (e.g., sender name, internet protocol (IP) address, routing path, host server, account name, etc.).

For example, the first processing category may include data objects to discard and the second processing category may include data objects to keep for further processing, analyzing or storage. As another example, the first processing category may include data objects of a first type (e.g., word search less than or equal to a threshold number of hits) and the second processing category may include data objects of a second type (e.g., word search greater than a threshold number of hits). As yet another example, the first processing category may include data objects associated with a first internet protocol (IP) address and the second processing category may include data objects associated with a second internet protocol (IP) address. As yet a further example, the first processing category may include voice data within a first frequency range (e.g., 85-169.99 Hertz) and second processing category may include voice data within a second frequency range (e.g., 170.00-255 Hertz).

For the data objects that have the second data type ID, the method continues at step 104, where the plurality of computing devices sends data objects having the second data type identifier to a second group of computing devices of the plurality of computing devices. Note that although two data type IDs are discussed, a large amount (e.g., tens, hundreds, etc.) of different data types may be present within the DSN. The method continues to step 106, where the second group of processing devices processes the data objects having the second data type ID according to a second data type ID protocol. For example, the second data type ID protocol may indicate that the data objects are to be discarded. As another example, the second data type ID protocol may indicate that the data objects are to be sorted based on second sorting criteria into a third processing category and a fourth processing category. The data objects in the fourth processing category may then be dispersed storage error encoded based on short term storage error encoding parameters to produce second pluralities of sets of encoded data slices, which are sent to a second set of storage and execution units for storage and further processing.

When the data objects having the first data type ID are sorted into the first processing category, the method continues with step 112, where the first group of computing devices processes the data objects according to a first processing category protocol. For example, the first processing category protocol may indicate to discard the data objects. As another example, the first processing category protocol may indicate to send the data objects of the first processing category to a second set of storage and execution units for storage and further processing.

When the data objects having the first data type ID are sorted into the second processing category, the method continues with step 114, where the first group of computing devices dispersed storage error encodes the data objects in the second processing category based on short term storage error encoding parameters to produce pluralities of sets of encoded data slices. For example, the short term storage error encoding parameters may indicate to encode with minimal redundancy (e.g., pillar width number−decode threshold number=<3). As another example, the short term storage error encoding parameters may indicate to encode using a small (e.g., 8) decode threshold number. The method continues with step 116, where the first group of computing devices sends the pluralities of sets of encoded data slices to a set of storage and execution units for storage and further processing.

The method continues with step 118, where the set of storage and execution units (e.g., storage units 36 of FIG. 1 that include the computing core 26 and DS client module 34 of FIG. 1) interprets the pluralities of sets of encoded data slices to determine data objects of interest of the data objects of the second processing category based on interest criteria. The interest criteria may include the likelihood that a data object matches a flagged category. For example, the interest criteria may be the percentage a facial recognition analysis matches a stored facial recognition analysis of person on the Federal Bureau of Investigation's most wanted list. As another example, the interest criteria may be a combination of the data type and results from sorting. For example, the interest criteria may be to store data objects for further processing that are government email that include a buzzword search of "agent Jones" and "classified." As yet another example, the interest criteria may include the combination of sorting criteria (e.g., does data object include both an image of "location x" and is sent from a particular IP address).

The method continues with step 120, where the set of storage and execution units dispersed storage error encodes the data objects of interest based on long term storage error encoding parameters to produce second pluralities of sets of encoded data slices. For example, the long term storage error encoding parameters may indicate to encode with a large redundancy (e.g., pillar width number−decode threshold number>=20). As another example, the long term storage error encoding parameters may indicate to encode using a large (e.g., 40) decode threshold number. The method continues with step 122, where the set of storage and execution units sends the second pluralities of sets of encoded data slices to a second set of storage and execution unit units for storage and subsequent processing.

Note that the method steps described here may be implemented by a computer readable memory device that includes one or more memory elements (e.g., a first memory element, a second memory element, a third memory element, a fourth memory element, a fifth memory element, a sixth memory element, etc.) for storing operational instructions that when executed by the plurality of computing devices, cause the plurality of computing devices to perform the method steps. Further note that the dispersed storage error encoding may be modified to more reliable encoding as more analyzation of the data objects are desired.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution in a storage network, the method comprises:
   determining, by one or more storage and execution units of the storage network, data objects of interest from data objects that are associated with a particular processing category, wherein the determining the data objects of interest is based on interest criteria, wherein the data objects are associated with data type identifiers of a plurality of data type identifiers, and wherein the plurality of data type identifiers correspond to a plurality of data types associated with a plurality of data objects that include the data objects;
   error encoding, by the one or more of storage and execution units, the data objects of interest based on long term storage error encoding parameters to produce pluralities of sets of encoded data slices; and
   sending, by the one or more of storage and execution units, the pluralities of sets of encoded data slices to a second set of storage and execution units for storage therein.

2. The method of claim 1, wherein a data type of the plurality of data types comprises one or more of:
   a data file;
   an email;
   a blog;
   a white paper;
   a social media post; and
   graphics.

3. The method of claim 1 further comprises:
receiving the plurality of data objects; and
assigning a data type identifier of the plurality of data type identifiers to each data object of the plurality of data objects based on a data type of the each data object.

4. The method of claim 1, wherein the long term storage error encoding parameters comprise a pillar width to decode threshold difference greater than a long term difference threshold.

5. The method of claim 1, wherein the long term storage error encoding parameters comprise a pillar width number greater than a long term pillar width number threshold.

6. The method of claim 1, wherein the long term storage error encoding parameters comprise a decode threshold number greater than a long term decode number threshold.

7. The method of claim 1, wherein the interest criteria comprises:
a data type of the plurality of data types and a result from sorting the plurality of data objects into the particular processing category based on sorting criteria.

8. The method of claim 7, wherein the sorting criteria comprises one or more of:
a word search;
an image search;
destination information;
facial recognition;
an encryption type; and
source information.

9. A computer readable memory device of a storage network comprises:
at least one memory element for storing operational instructions that, when executed by at least one of one or more storage and execution units of the storage network and one or more computing devices of the storage network, causes the at least one of the one or more storage and execution units of the storage network and the one or more computing devices to:
determine data objects of interest from data objects that are associated with a processing category, wherein the determining the data objects of interest is based on interest criteria, wherein the data objects are associated with data type identifiers of a plurality of data type identifiers, and wherein the plurality of data type identifiers correspond to a plurality of data types associated with a plurality of data objects that include the data objects;
error encode the data objects of interest based on long term storage error encoding parameters to produce pluralities of sets of encoded data slices; and
send the pluralities of sets of encoded data slices to a second set of storage and execution units for storage.

10. The computer readable memory device of claim 9, wherein a data type of the plurality of data types comprises one or more of:
a data file;
an email;
a blog;
a white paper;
a social media post; and
graphics.

11. The computer readable memory device of claim 9, wherein the at least one memory element stores further operational instructions that, when executed by the at least one of the one or more storage and execution units and the one or more computing devices, causes the at least one of the one or more storage and execution units and the one or more computing devices to:
receive the plurality of data objects; and
assign a data type identifier of the plurality of data type identifiers to each data object of the plurality of data objects based on a data type of the each data object.

12. The computer readable memory device of claim 9, wherein the at least one memory element stores further operational instructions that, when executed by the at least one of the one or more storage and execution units and the one or more computing devices of the plurality of computing devices, causes the at least one of the one or more storage and execution units and the one or more computing devices to:
determine the long term storage error encoding parameters include a pillar width to decode threshold difference greater than a long term difference threshold.

13. The computer readable memory device of claim 9, wherein the at least one memory element stores further operational instructions that, when executed by the at least one of the one or more storage and execution units and the one or more computing devices, causes the at least one of the one or more storage and execution units and the one or more computing devices to:
determine the long term storage error encoding parameters include a decode threshold number greater than a long term decode number threshold.

14. The computer readable memory device of claim 9, wherein the at least one memory element stores further operational instructions that, when executed by the at least one of the one or more storage and execution units and the one or more computing devices, causes the at least one of the one or more storage and execution units and the one or more computing devices to:
determine the long term storage error encoding parameters include a pillar width number greater than a long term pillar width number threshold.

15. The computer readable memory device of claim 1, wherein the interest criteria comprises:
a data type of the plurality of data types and a result from sorting the plurality of data objects into the particular processing category based on sorting criteria.

16. The computer readable memory device of claim 15, wherein the sorting criteria comprises one or more of:
a word search;
an image search;
destination information;
facial recognition;
an encryption type; and
source information.

* * * * *